(12) United States Patent
Schillinger et al.

(10) Patent No.: US 10,178,781 B2
(45) Date of Patent: Jan. 8, 2019

(54) ELECTRONIC DEVICE AND METHOD FOR PRODUCING AN ELECTRONIC DEVICE

(71) Applicant: Continental Teves AG & Co. oHG, Frankfurt (DE)

(72) Inventors: Jakob Schillinger, Gaimersheim (DE); Ulrich Schrader, Wöllstadt (DE); Dietmar Huber, Rödermark (DE)

(73) Assignee: Continental Teves AG & Co. oHG, Frankfurt (DE)

( * ) Notice: Subject to any disclaimer, the term of this patent is extended or adjusted under 35 U.S.C. 154(b) by 0 days.

(21) Appl. No.: 14/650,427

(22) PCT Filed: Nov. 29, 2013

(86) PCT No.: PCT/EP2013/075188
§ 371 (c)(1),
(2) Date: Jun. 8, 2015

(87) PCT Pub. No.: WO2014/095316
PCT Pub. Date: Jun. 26, 2014

(65) Prior Publication Data
US 2015/0373861 A1 Dec. 24, 2015

(30) Foreign Application Priority Data

Dec. 20, 2012 (DE) .................. 10 2012 224 102
Sep. 6, 2013 (DE) .................. 10 2013 217 892

(51) Int. Cl.
*H05K 5/00* (2006.01)
*G01R 1/04* (2006.01)
(Continued)

(52) U.S. Cl.
CPC ......... *H05K 5/0034* (2013.01); *G01D 11/245* (2013.01); *G01D 18/00* (2013.01);
(Continued)

(58) Field of Classification Search
None
See application file for complete search history.

(56) References Cited

U.S. PATENT DOCUMENTS 4,295,117 A 10/1981 Lake
5,055,321 A * 10/1991 Enomoto ............. H05K 1/0373
216/18
(Continued)

FOREIGN PATENT DOCUMENTS

CN 1328716 12/2001
CN 1510742 7/2004
(Continued)

OTHER PUBLICATIONS

Amesoeder, S. et al., "Plasma Sorgt Fuer Festen Verbund," Kunstoffe, Carl Hanser Verlag, Munchen, DE, Jan. 1, 2003, pp. 124-129, vol. 93, No. 9, ISSN: 0023-5563.
(Continued)

*Primary Examiner* — Courtney Smith
*Assistant Examiner* — Rashen E Morrison
(74) *Attorney, Agent, or Firm* — RatnerPrestia

(57) ABSTRACT

An electronic device including: an electronic circuit accommodated in a circuit housing having a first thermal expansion coefficient, and a molded body which surrounds the circuit housing, the body having a second thermal expansion coefficient that differs from the first thermal expansion coefficient. The molded body is fixed to the circuit housing at least at two different mutually spaced fixing points on the circuit housing.

8 Claims, 3 Drawing Sheets

(51) Int. Cl.
*G01R 33/09* (2006.01)
*G01D 11/24* (2006.01)
*G01D 18/00* (2006.01)
*H05K 3/28* (2006.01)
*H01L 23/544* (2006.01)
*H05K 1/02* (2006.01)
*H05K 5/06* (2006.01)

(52) U.S. Cl.
CPC .............. *G01R 1/04* (2013.01); *G01R 33/09* (2013.01); *H01L 23/544* (2013.01); *H05K 1/0266* (2013.01); *H05K 3/284* (2013.01); *H05K 5/003* (2013.01); *H05K 5/0017* (2013.01); *H05K 5/062* (2013.01); *H01L 2223/54433* (2013.01); *H01L 2223/54486* (2013.01); *H01L 2224/48091* (2013.01); *H01L 2224/48137* (2013.01); *H01L 2924/1461* (2013.01); *Y10T 29/49004* (2015.01); *Y10T 29/49147* (2015.01)

(56) References Cited

U.S. PATENT DOCUMENTS

| | | | | |
|---|---|---|---|---|
| 5,359,982 | A * | 11/1994 | Taruya | F02P 3/02 123/634 |
| 5,383,788 | A * | 1/1995 | Spencer | H01R 12/62 439/493 |
| 5,557,066 | A * | 9/1996 | Rostoker | H01L 23/295 174/50.61 |
| 5,598,034 | A * | 1/1997 | Wakefield | H01L 23/315 257/706 |
| 5,740,787 | A * | 4/1998 | Ando | F02P 3/02 123/635 |
| 5,927,259 | A * | 7/1999 | Ando | F02P 3/02 123/634 |
| 6,034,421 | A | 3/2000 | Tokunaga | |
| 6,127,633 | A * | 10/2000 | Kinoshita | H05K 3/381 174/255 |
| 6,221,459 | B1 | 4/2001 | James | |
| 6,286,207 | B1 * | 9/2001 | Oura | C23C 18/1608 205/126 |
| 7,417,315 | B2 | 8/2008 | Hougham | |
| 7,473,845 | B2 | 1/2009 | Berchtold | |
| 7,849,843 | B2 * | 12/2010 | Kojima | H01F 38/12 123/635 |
| 7,901,971 | B2 | 3/2011 | Hunziker | |
| 8,207,607 | B2 * | 6/2012 | Yamagishi | H01L 23/315 257/680 |
| 8,355,254 | B2 * | 1/2013 | Oota | B62D 5/0406 174/520 |
| 8,742,563 | B2 | 6/2014 | Meyer | |
| 8,820,160 | B2 | 9/2014 | Doering | |
| 9,014,921 | B2 | 4/2015 | Bretzigheimer | |
| 9,562,552 | B2 * | 2/2017 | Chang | G06F 3/0421 |
| 2002/0170897 | A1 | 11/2002 | Hall | |
| 2004/0118227 | A1 | 6/2004 | Tokunaga | |
| 2005/0057883 | A1 * | 3/2005 | Bolken | H01L 21/4803 361/301.3 |
| 2006/0027900 | A1 * | 2/2006 | Takeuchi | H01L 23/4334 257/675 |
| 2007/0252249 | A1 * | 11/2007 | Murai | H01L 23/3128 257/666 |
| 2008/0170372 | A1 * | 7/2008 | Kirigaya | H05K 5/065 361/720 |
| 2013/0286565 | A1 * | 10/2013 | Tsuduki | H05K 5/0091 361/679.01 |
| 2014/0117979 | A1 * | 5/2014 | Heimlicher | H03K 17/9505 324/207.16 |
| 2015/0173227 | A1 * | 6/2015 | Ott | G01P 1/026 361/728 |
| 2015/0276556 | A1 * | 10/2015 | Biegner | G01L 17/005 73/584 |

FOREIGN PATENT DOCUMENTS

| | | |
|---|---|---|
| CN | 101667548 | 3/2010 |
| DE | 54401 | 3/1967 |
| DE | 4327309 | 2/1994 |
| DE | 19824642 | 12/1998 |
| DE | 20017105 | 1/2001 |
| DE | 10300171 | 7/2004 |
| DE | 10300175 | 7/2004 |
| DE | 10313832 | 10/2004 |
| DE | 102004015597 | 11/2005 |
| DE | 102006032073 | 1/2008 |
| DE | 102008043773 | 5/2010 |
| DE | 102011080789 | 2/2012 |
| JP | 2005011978 | 1/2005 |
| JP | 2012073113 | 4/2012 |
| WO | 2010037810 | 4/2010 |
| WO | 2011043488 | 4/2011 |

OTHER PUBLICATIONS

German Search Report for German Application No. 10 2013 217 892.1 dated Sep. 2, 2014, including partial translation.
International Search Report for International Application No. PCT/EP2013/075188 dated Dec. 1, 2014.
Japanese Office Action dated May 13, 2016 for Japanese Application No. 2015-548322, including English translation, 4 pages.
Chinese Office Action dated Apr. 1, 2016 for Chinese Application No. 201380067259.1, including English translation, 14 pages.
European Office Action for European Application No. 13 799 037.0, dated Feb. 23, 2017, including English translation, 8 pages.

* cited by examiner

ELECTRONIC DEVICE AND METHOD FOR PRODUCING AN ELECTRONIC DEVICE

CROSS REFERENCE TO RELATED APPLICATIONS

This application is the U.S. National Phase Application of PCT International Application No. PCT/EP2013/075188, filed Nov. 29, 2013, which claims priority to German Patent Application No. 10 2012 224 102.7, filed Dec. 20, 2012 and German Patent Application No. 10 2013 217 892.1, filed Sep. 6, 2013, the contents of such applications being incorporated by reference herein.

FIELD OF THE INVENTION

The invention relates to an electronic device and a method for producing the electronic device.

BACKGROUND OF THE INVENTION

WO 2010/037 810 A1 incorporated by reference herein discloses an electronic device in the form of a sensor for outputting an electrical signal based upon a determined physical variable. The electronic device comprises an electronic circuit that is enclosed in a circuit housing.

SUMMARY OF THE INVENTION

An aspect of the invention is to improve the known electronic device.

In accordance with one aspect of the invention, an electronic device comprises an electronic circuit that is enclosed in a circuit housing having a first coefficient of thermal expansion and preferably can be contacted by way of an electrical signal connection by an external circuit, said electronic device also comprises a molded body that surrounds the circuit housing, said molded body having a second coefficient of thermal expansion that is different to the first coefficient of thermal expansion, wherein the molding compound is fixed to the circuit housing at at least two different fixing points on the circuit housing that are spaced apart with respect to one another.

The coefficient of thermal expansion within the scope of the disclosed electronic device describes the heat-dependent expansion and shrinkage of the circuit housing or the molding compound respectively.

The basic principle of the disclosed electronic device is that on the one hand the electronic circuit that is used must be protected against mechanical and electrical damage, on the other hand however said electronic circuit must be tailored suit to its end application. While the mechanical and electrical protection can be produced in the form of the circuit housing together with the electronic circuit itself in mass production, the shape of the molding compound depends on the end application and must be individually produced for this application.

It has shown itself to be favorable with regard to manufacturing technology for the circuit housing that provides protection against mechanical and electrical damage to use a different material to that used for the shape-providing molding compound. In general, the two materials also comprise different coefficients of thermal expansion that can lead to different thermal movements between the circuit housing and the molding compound. For this reason, the molding compound could after a time detach from the circuit housing so that the circuit housing could in the worst case fall out of the molding compound and therefore out of the end application.

In order to avoid this, the molding compound could be fixed to the circuit housing. This could be achieved by way of example as a result of selecting a corresponding adhesive substance that produces a fixed connection to the circuit housing. In the case of an entirely two-dimensional fixing arrangement between the circuit housing and the molding compound, the problem however arises that as a result of the different coefficients of expansion between molding compound and the circuit housing, the two become mechanically stressed with respect to one another. These mechanical stressing arrangements then also act upon the electrical circuit and load said circuit accordingly.

The disclosed electronic device proposes only fixing the molding compound to the circuit housing by way of fixing points that are spaced apart with respect to one another. These fixing points can also be parts of fixing surfaces, wherein however the fixing surfaces are then spaced apart with respect to one another. The molding compound that in general is softer than the circuit housing can then be placed like a cloth around the circuit housing and can be fixed to said circuit housing at the mentioned fixing points. In a known manner, a cloth that is fastened at various points to an expanding body forms folds such as can be observed by way of example whilst putting on a jacket that is too tight. The mechanical stresses act as directionally dependent ripples that can be used within the scope of the disclosed electronic housing in order to mechanically protect the electronic circuit.

In a further development of the disclosed electronic device, the two fixing points are selected in such a manner that a thermal deformation of the molding compound on the electronic circuit, said deformation being caused as a result of the second coefficient of thermal expansion, counteracts a thermal deformation of the circuit housing that is caused as a result of the first coefficient of thermal expansion. For the selection, it is possible by way of example to simulate by way of example the electronic device, wherein the at least two fixing points are then displaced within the scope of the simulation until the counteraction of the deformation of the molding compound and the deformation of the circuit housing at the site of the electronic circuit fulfills a specific criterion. For the simulation, a suitable mathematical model can be produced by the electronic device in a known manner and the stresses that are to be expected can be investigated.

It is particularly preferred that the above mentioned criterion is selected in such a manner that in the case of a corresponding selection of the fixing points, the deformation of the molding compound and the deformation of circuit housing cancel each other out so that mechanical loads on the electronic circuit as a result of the different thermal expansion between the molding compound and the circuit housing are minimized.

In another further development of the disclosed electronic device, at least one of the fixing points is selected in such a manner that a gap between the circuit housing and the molding compound is sealed to prevent the penetration of moisture. The basic principle of the further development is that the molding compound could detach from the circuit housing as a result of the above previously described effects of thermal expansion and a gap could thus form between the molding compound and the circuit housing. Moisture and other reagents could penetrate into this gap and after a prolonged period of operation of the electronic device could lead to a corrosion or a migration of the electronic device by way of example in the region of a signal connection and thus could accordingly interrupt or short circuit the signal connection. In order to avoid short circuits of this type or other damage that is caused as a result of moisture, at least one of the fixing points should be positioned in such a manner that the above mentioned gap is sealed with respect to an outer side.

In another further development of the disclosed electronic device, the molding compound can be injection molded or poured around the circuit housing, wherein its shrinkage during the thermosetting process after the injection molding or pouring process is selected so as to be less than shrinkage that occurs during a process of cooling from a working temperature of the electronic device to a solidification temperature of the molding compound. In this manner, it is ensured that the molding compound also lies on the circuit housing during the solidification process and thus reliably closes the gap in the manner described above.

In yet another further development of the disclosed electronic device, the surface of the circuit housing activates at the fixing points. The term an "activation of the surface of the circuit housing" is to be understood to mean hereinunder an in part break down of the molecular structure of the surface of the circuit housing so that free radicals occur at the surface of the circuit housing. These free radicals are in the position to form chemical and/or physical connections to the molding compound so that said molding compound can no longer detach from the surface of the circuit housing. In this manner, the molding compound is fixed securely to the circuit housing.

The molding compound can comprise a polar material such as polyamide. The polar polyamide can physically connect to the activated surface of the circuit housing in a manner known to the person skilled in the art and can thus be securely fixed to the circuit housing. Further connections are possible that comprise a polar surface in the melted state of the molding compound and as a consequence, form a connection to the activated surface of the circuit housing. This connection that is produced is preserved after the solidification process of the melted molding compound.

In an additional further development of the disclosed device, at least one part of the surface of the circuit housing is roughened in the contact region that is fixed to the molding compound so that the effectively activated surface enlarges and the bonding effect between circuit housing and molding compound is increased.

In a particular further development of the disclosed electronic device, the roughened part of the surface of the circuit housing is roughened using a laser. Using the laser, it is possible to not only activate the surface but by means of the laser, mold-separating means that are possibly present are also removed from the surface of the circuit housing, said mold-separating means could inhibit a bonding arrangement between the circuit housing and the molding compound.

Alternatively, the laser can also be used to roughen the surface. The activation can then be performed by way of example using a plasma.

In a particularly preferred further development of the electronic device, the roughened part of the surface of the circuit housing is roughened into the form of an identifiable feature. In this manner, the roughening can additionally be used to identify the electronic device. The feature can be selected in any arbitrary manner. The feature can thus by way of example be a machine-readable code or a numerical code that can be recognized by a user.

In an alternative further development, the disclosed electronic device is embodied as a sensor so as, using the circuit, to output an electrical signal based upon a determined physical variable. The electronic circuit can comprise a measuring sensor so as to determine the physical variable. The physical variable can be by way of example the position in space of an object that the sensor is fastened to, a mechanical stress, a magnetic field or any other physical variable. In sensors of this type, the above mentioned mechanical stresses that are caused on the measuring sensor by the circuit housing and the molding compound lead to so-called mechanical interference errors that distort the actual electrical signal that is carrying the relevant information regarding the physical variables. This is where the disclosed electronic device particularly has an effect because as a result of minimizing the mechanical stresses at the electronic circuit, the mechanical interference errors of the measuring sensor are also minimized while generating the electrical signal that is dependent upon the physical variable.

In accordance with a further aspect of the invention, a method for producing an electronic device comprises the steps of:

enclosing an electronic circuit in a circuit housing,
activating the circuit housing at at least two fixing points that are spaced apart with respect to one another, and
enclosing the activated circuit housing with a molding compound in such a manner that the enclosed region of the circuit housing comprises at least the fixing points.

The disclosed method can be expanded with features that correspond to the above mentioned device in an expedient manner.

BRIEF DESCRIPTION OF THE DRAWINGS

The above described characteristics, features and advantages of this invention and also the manner in which they are achieved become more clearly understandable in connection with the description hereinunder of the exemplary embodiments that are further described in connection with the drawings, wherein.

DETAILED DESCRIPTION OF THE PREFERRED EMBODIMENTS

Figure 1:
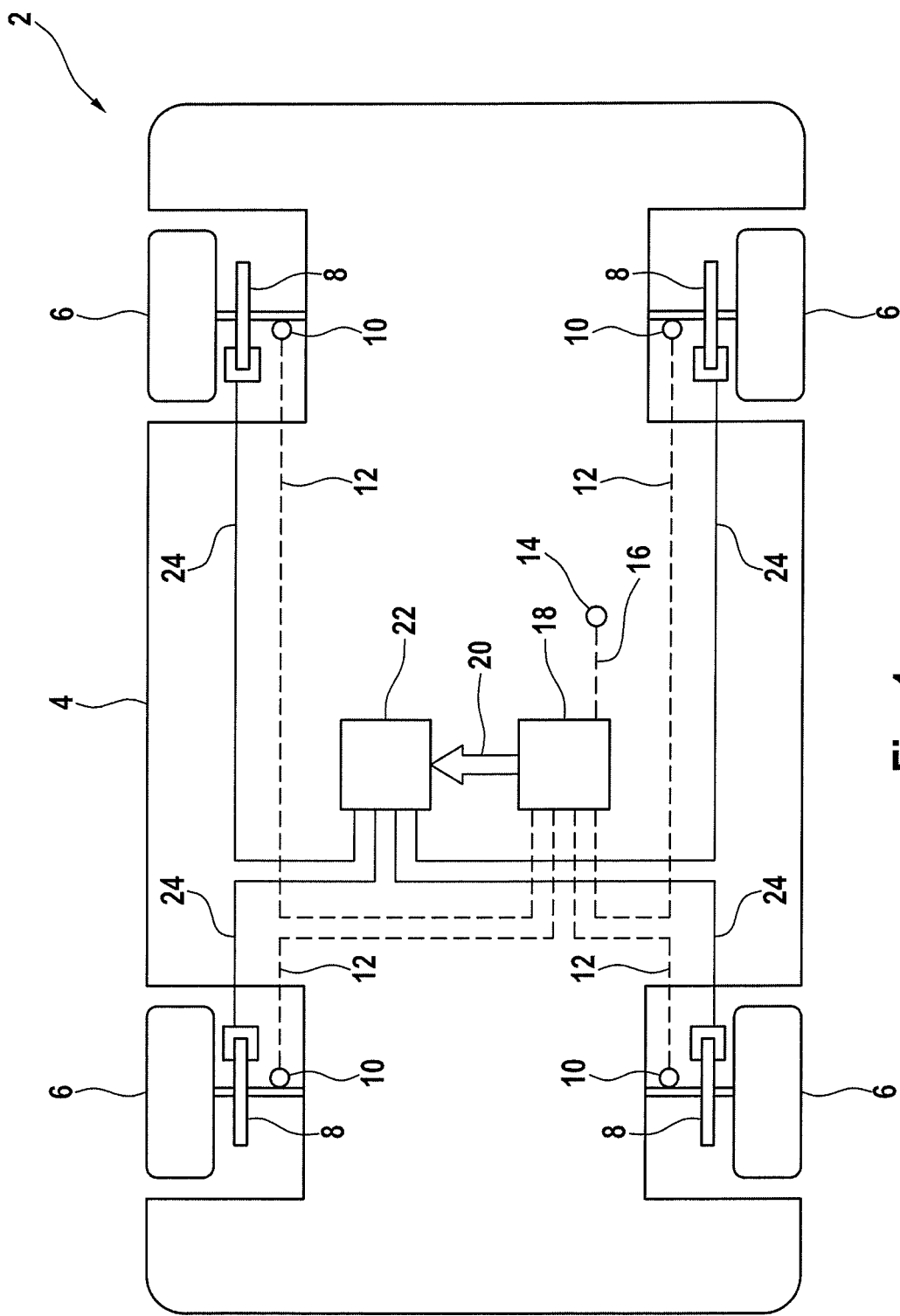
FIG. 1 illustrates a schematic view of a vehicle having a dynamic driving control system.

Identical technical elements in the figures are provided with identical reference numerals and are only described once.

Reference is made to FIG. 1 that illustrates a schematic view of a vehicle 2 having a known dynamic driving control system. Details regarding this dynamic driving control system can be found in by way of example DE 10 2011 080 789 A1 incorporated by reference herein.

The vehicle 2 comprises a chassis 4 and four wheels 6. Each wheel 6 can be decelerated with respect to the chassis 4 by way of a brake 8 that is fixed to the chassis 4 in a positionally fixed manner in order to decelerate a movement of the vehicle 2 on a road that is not further illustrated.

It can happen in a manner that is known to the person skilled in the art that the wheels 6 of the vehicle 2 lose their road grip and the vehicle 2 can be moved from a trajectory as a result of under-steer or over-steer, said trajectory being determined by way of example by way of a steering wheel that is not further illustrated. This is avoided by means of known control circuits such as ABS (antilock braking system) and ESP (electronic stability program).

In the present embodiment, the vehicle 2 comprises for this reason rotational speed sensors 10 on the wheels 6 and said rotational speed sensors determine a rotational speed 12 of the wheels 6. In addition, the vehicle 2 comprises an inertial sensor 14 that determines dynamic driving data 16 of the vehicle 2 and from said dynamic driving data it is possible to output by way of example a pitch rate, a roll rate, a yaw rate, a lateral acceleration, a longitudinal acceleration and/or a vertical acceleration in a manner that is known to the person skilled in the art.

Based upon the determined rotational speeds 12 and driving dynamic data 16, a controller 18 can determine in a manner known to the person skilled in the art whether the vehicle 2 is slipping on the road surface or is even deviating from the above mentioned predetermined trajectory and can react to said deviation according to a controlling signal 20 that is known per se. The controller output signal 20 can then be used by a positioning device 22 in order by means of signals 24 to control control elements such as the brakes 8 that react to the slipping action and to the deviation from the predetermined trajectory in a manner known per se.

The controller 18 can be integrated by way of example into a motor control of the vehicle 2, said motor control being known per se. The controller 18 and the positioning device 22 can also be embodied as a common control device and can be optionally integrated into the motor control in the above mentioned manner.

FIG. 1 illustrates the inertial sensor 14 as an external device outside the controller 18. In a case of this type, said inertial sensor is known as an inertial sensor 14 embodied as satellites. However, the inertial sensor 14 could also be constructed as an SMD component so that said inertial sensor can be integrated by way of example in a housing of the controller 18.

Figure 2:
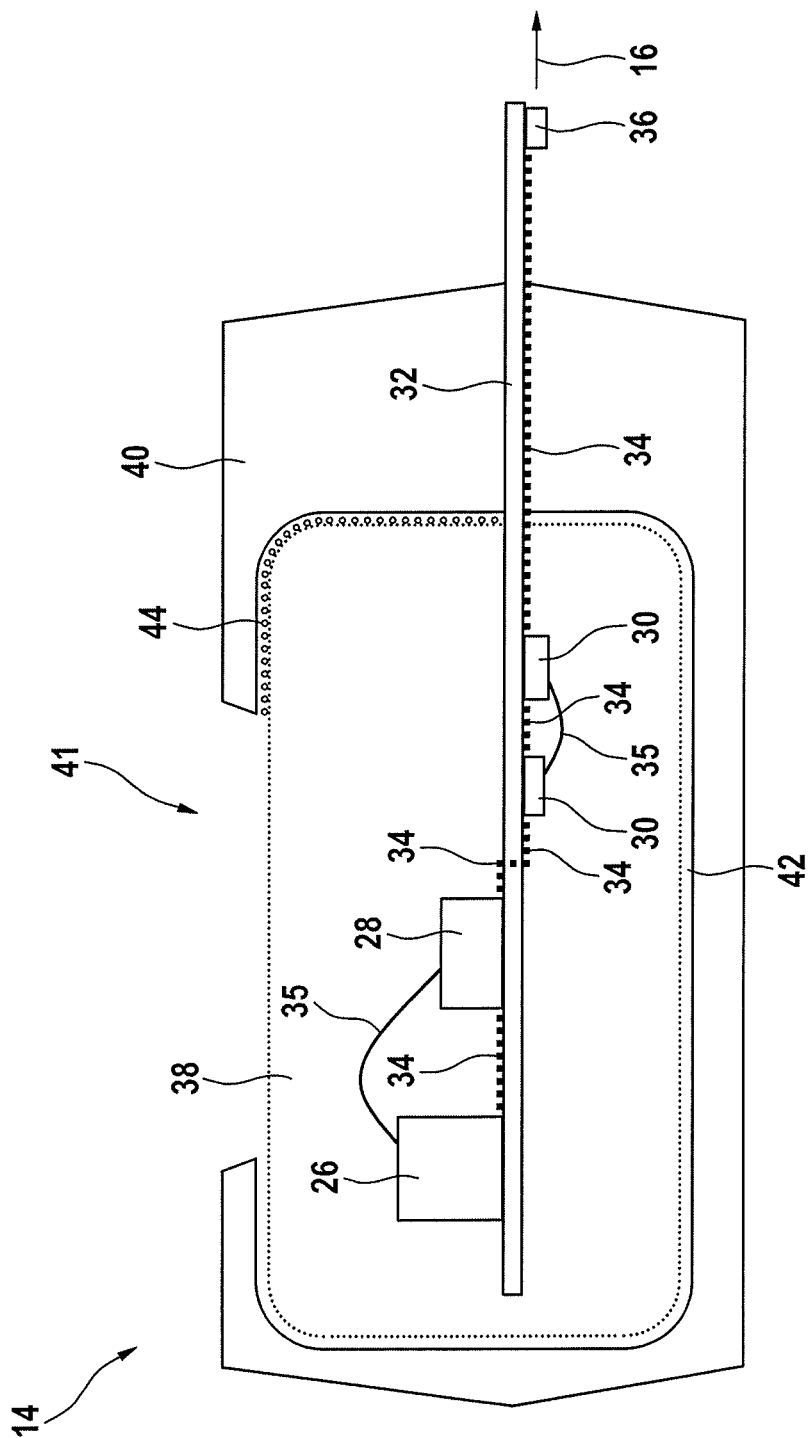
FIG. 2 illustrates a schematic view of an inertial sensor from FIG. 1.

Reference is made to FIG. 2 that illustrates the inertial sensor 14 in a schematic illustration.

The inertial sensor 14 comprises an electronic circuit having at least one microelectromechanical system 26, called MEMS 26, as a measuring sensor that in a known manner outputs a signal that is not further illustrated and is dependent upon the driving dynamic data 16 by way of an amplifying circuit 28 to two signal evaluating circuits 30 in the form of application-specific integrated circuit 30, ASIC 30. The ASIC 30 can then generate the driving dynamic data 16 based upon the received signal that is dependent upon the driving dynamic data 16.

The MEMS 26, the amplifying circuit 28 and the ASIC 30 are carried on a circuit board 32 and are contacted in an electrical manner by different electrical lines 34, which are formed on the circuit board 32, and bond wires 35. Alternatively, the circuit board 32 could also be embodied as a lead frame. An interface 36 could be present so as to output the driving dynamic data 16 that is generated.

In addition, the MEMS 26 and the ASIC 30 can be molded into a circuit housing 38 that can be produced by way of example from thermosetting material. The circuit housing 38 could therefore already be used alone as the housing of the inertial sensor 14 and could protect the circuit components that are received within said housing.

However, the inertial sensor 14 is not limited to the application in the driving dynamic control system that is described in the introduction and is therefore produced for a plurality of different end applications. In order to integrate the inertial sensor 14 into the driving dynamic control system, said inertial sensor is also injection molded using a molding compound 40, also known as an overmold 40. An overmold opening 41 can be left in the molding compound 40 in order by way of example to expose a serial number sign that is not further illustrated.

This molding compound 40 can be by way of example a thermoplastic and comprises a coefficient of thermal expansion that is different to the coefficient of thermal expansion of the circuit housing 38.

As a result of these different coefficients of thermal expansion, the circuit housing 38 and the molding compound 40 expand in a different manner under the influence of temperature and, as is illustrated in FIG. 2, detach from one another after a specific expansion so that between the circuit housing 38 and the molding compound 40 a gap 42 is formed by way of which inter alia moisture 44 can penetrate and can damage the circuit board 32 having the conductor paths 34.

Figure 3:
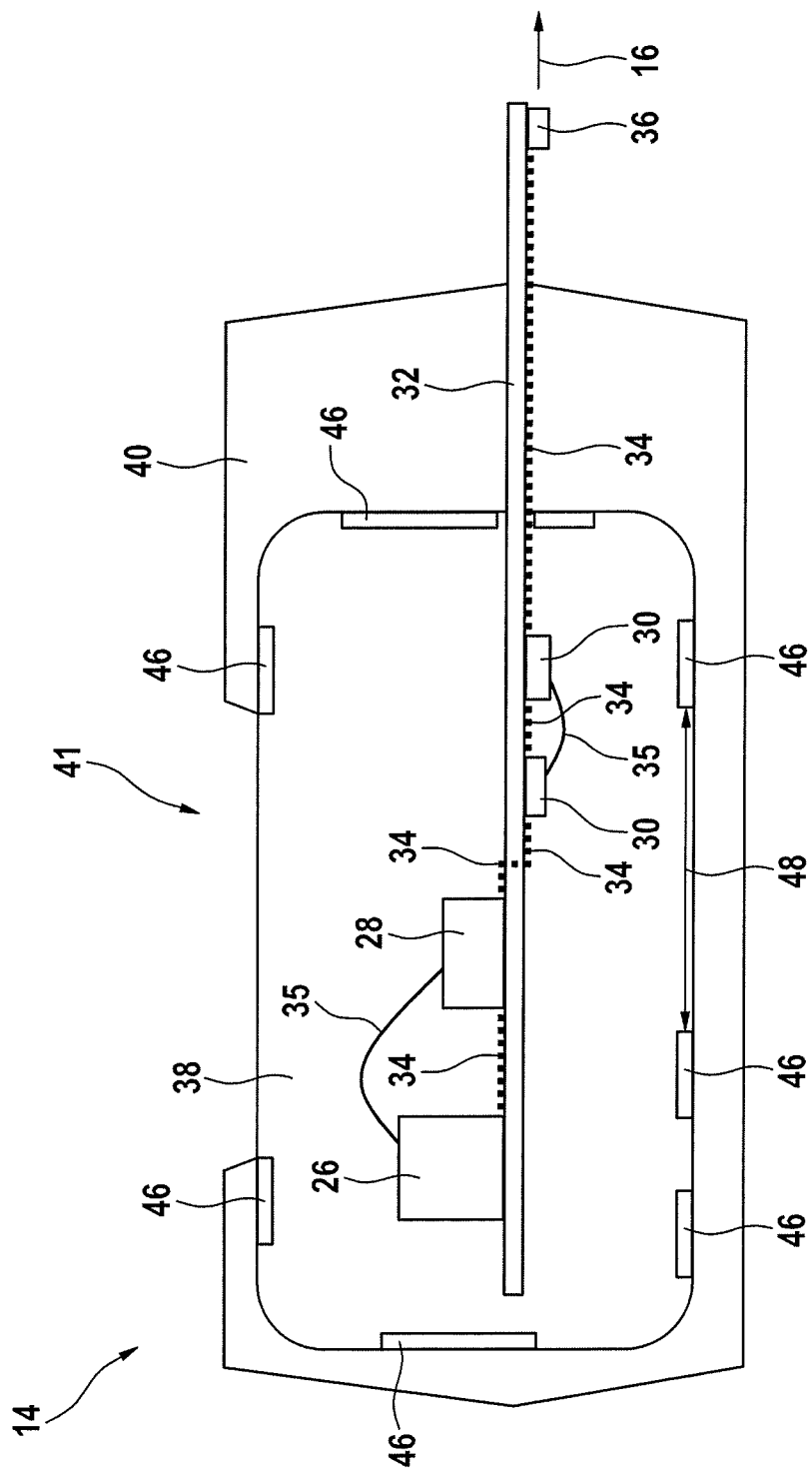
FIG. 3 illustrates a further schematic view of the inertial sensor from FIG. 1.

In order to avoid these gaps forming, the circuit housing 38 in the present embodiment, as is illustrated in FIG. 3, is activated on the surface in specific surface zones 46. Within the scope of the activation, the molecular structure of the surface of the circuit housing 38 is in part broken down in the region of the surface zones 46 so that free radicals occur on the surface of the circuit housing 38. These free radicals are in the position to form chemical and/or physical connections with the molding compound 40 so that said molding compound can no longer detach from the surface of the circuit housing 38 in the region of the surface zones 46. In this manner, the molding compound 40 is fixedly fastened to the circuit housing 38.

In the present embodiment, the surface zones 46 are embodied in addition in predetermined spacings 48 with respect to one another and in FIG. 3 only one of said spacings is illustrated with a spacing arrow for reasons of clarity. The surface of the circuit housing 38 is not activated within these spacings 48 so that the molding compound 40 remains movable with respect to the circuit housing 38. The molding compound 40 can therefore contort in the case of a thermal movement of the circuit housing 38, fixed at the activated surface zones 46 of the circuit housing 38 like a cloth and a mechanical stress that is applied as a result of the thermal movement of the circuit housing 38 to the molding compound 40 counteracts a particular mechanical stress. If the spacings 48 of the surface zones 46 are suitably selected, the mechanical stresses of the circuit housing 38 and the molding compound 40 on the site of the MEMS 26 can cancel each other out and therefore reduce mechanical interference errors of the MEMS 26 that would otherwise occur under the influence of these mechanical stresses.

In order to suitably place the activated surface zones 46 in such a manner that the mechanical stresses cancel each other out at the site of the MEMS 26, by way of example the inertial sensor 14 can be mechanically simulated in advance. Alternatively, the position of the activated surface zones 46 could also naturally be tested on prototypes.

In order to avoid the penetration of the above mentioned moisture 44, as a further basic condition at least one of the activated surface zones 46 could extend around an edge of the overmold opening 41.

The activation can be performed using a laser, wherein some activated surface zones 46 could be embodied so as to carry information. These surface zones 46 could thus be embodied by way of example as strings of characters that subsequently render it possible to read data regarding the inertial sensor such as by way of example production date and/or location.

The invention claimed is:

1. An electronic device, comprising:
   an electronic circuit that is enclosed in a circuit housing having a first coefficient of thermal expansion, a surface of the circuit housing having at least two roughened areas that are spaced apart from one another with an unroughened area of the surface of the circuit housing therebetween, the at least two roughened areas being formed using a laser to in part break down a molecular structure of the surface of the circuit housing, and
   a molded body that surrounds the circuit housing, said molded body formed from molding compound having a second coefficient of thermal expansion that is different from the first coefficient of thermal expansion,
   wherein molding compound is fixed to the circuit housing at the at least two roughened areas on the surface of the circuit housing.

2. The electronic device as claimed in claim 1, wherein the at least two roughened areas are selected in such a manner that a thermal deformation of the molding compound on the electronic circuit that is caused by the second coefficient of thermal expansion counteracts a thermal deformation of the circuit housing that is caused by the first coefficient of thermal expansion.

3. The electronic device as claimed in claim 2, wherein the roughened areas are selected in such a manner that the deformation of the molding compound and the deformation of the circuit housing cancel each other out.

4. The electronic device as claimed in claim 1, wherein at least one of the roughened areas is selected in such a manner that a gap between the circuit housing and the molding compound is sealed to prevent the penetration of moisture.

5. The electronic device as claimed in claim 1, wherein the roughened part of the surface of the circuit housing is roughened using the laser into the form of an identifiable feature.

6. The electronic device as claimed in claim 1, said electronic device being embodied as a sensor so as, using the circuit, to output an electrical signal based upon a determined physical variable.

7. A method for producing an electronic device comprising:
   enclosing an electronic circuit in a circuit housing,
   activating the circuit housing by using a laser to in part break down a molecular structure of a surface of the circuit housing to form at least two roughened areas on the surface of the circuit housing that are spaced apart with respect to one another with an unroughened area of the surface of the circuit housing therebetween, and
   enclosing the activated circuit housing using a molding compound in such a manner that the enclosed region of the circuit housing comprises at least the roughened areas.

8. The electronic device as claimed in claim 1, wherein the molding compound is fixed to the circuit housing without an intervening layer.

* * * * *